US006859082B2

United States Patent
Tang

(10) Patent No.: US 6,859,082 B2
(45) Date of Patent: Feb. 22, 2005

(54) BALANCED PROGRAMMABLE DELAY ELEMENT

(75) Inventor: Huajun Tang, Virginia Beach, VA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/266,968

(22) Filed: Oct. 7, 2002

(65) Prior Publication Data

US 2004/0066223 A1 Apr. 8, 2004

(51) Int. Cl.[7] .............................................. H03H 11/26
(52) U.S. Cl. ..................................... 327/276; 327/281
(58) Field of Search ................................. 327/276, 281, 327/270, 262, 158, 153, 149; 331/57, 17, 25, 109, 175; 375/373, 375, 376

(56) References Cited

U.S. PATENT DOCUMENTS 5,731,727 A * 3/1998 Iwamoto et al. ............ 327/281
5,790,612 A * 8/1998 Chengson et al. .......... 375/373
6,163,195 A * 12/2000 Jefferson .................... 327/262
6,188,637 B1 * 2/2001 Ooishi ........................ 365/233

* cited by examiner

Primary Examiner—Linh My Nguyen

(57) ABSTRACT

Balanced programmable delay element that has a variable incremental delay. A first inverter is provided that has a first electrode for receiving an input signal, a second electrode, a third electrode, and a fourth electrode for providing an output signal and that has a propagation delay that is dependent on a first current. A second inverter is provided that has a first electrode coupled to the fourth electrode of the first inverter for receiving the output signal of the first inverter, a second electrode, a third electrode, and a fourth electrode for providing an output signal and that has a propagation delay that is dependent on a second current. A current switch is coupled to the first inverter, the second inverter, receives at least two control signals, and responsive thereto, selectively varies the incremental delay of the delay element.

19 Claims, 8 Drawing Sheets

BALANCED PROGRAMMABLE DELAY ELEMENT

FIELD OF THE INVENTION

The present invention relates generally to delay lock loop (DLL) applications, and more particularly, to a balanced programmable delay element for use in DLL applications.

BACKGROUND OF THE INVENTION

In many integrated circuit packages, it is desirable to provide a reference clock signal (also commonly referred to as a system clock). Many devices use the reference clock signal to derive their respective timing. For example, a reference clock signal may be provided to memory devices, processors, or other circuitry located on an integrated circuit (or chip).

Often, it is desirable to delay the reference clock signal in a manner that creates multiple iterations of the clock signal. These multiple iterations of the reference clock are separated by a known period of time, which is commonly referred to as phase. For example, a known way of creating multiple iterations of a reference clock is to supply the reference clock to a delay locked loop (DLL). A DLL, as known in the art, is a device that takes the reference clock signal and passes the signal through one or multiple delay lines connected in series. With multiple delay lines connected in series, each delay line supplies a subsequent delay, such that multiple iterations of the reference clock signal appear at different times, and such that the total delay in the chain is equal to a single clock period under all PVT condition.

Programmable delay lines are required for the generation of accurately shaped waveforms, and for delaying electronic signals. These waveforms are used in automated test systems (ATEs), to measure time intervals and to sample data at circuit interfaces.

Specific applications require varying degrees of accuracy and resolution in the delay of the electronic signal. ATEs can require delay lines with a delay resolution of 10 to 20 picoseconds. Data sampling of circuit interfaces may, for example, only require delay lines with delay resolutions of 100 to 200 picoseconds for systems operating at 100 MHz. Strobe signals in high speed interfaces require delay lines in which the delay remains constant even though the delay line may be fabricated using varying process corners, and the delay line is subjected to varying temperatures and supply voltages.

Programmable delay lines have been designed using random access memory (RAM), coupled oscillators, shift registers, charge coupled devices (CCDs), ramp comparators, multiplexed delay lines and tapped delay lines. Each of these types of delay line designs suffers limitations. These limitations include the resolution of the delay of the delay line being too coarse, or the delay of the delay line being inconsistent. Delay inconsistencies can be due to variations in the process used to fabricate the delay line, or variations in the delay of the delay line due to variations in the temperature or voltage supply of the delay line.

In clock generation applications, an input clock signal is provided. However, a particular application may require different phases of the input clock signal. The clock generation application receives the input clock signal and based thereon generates a plurality of phases of the input clock signal.

U.S. Pat. No. 5,900,762, entitled, "Self-calibrating Electronic Programmable Delay Line Utilizing an Interpolation Algorithm," describes an example of a prior art programmable delay line.

One manner in which to generate phases of an input clock signal is to employ delay cells. For example, a delay chain that includes a plurality of delay taps, where each tap provides one of the phases of the input clock signal, is often utilized for clock signal generation. Each tap includes a plurality of delay cells. Each delay cell typically includes inverters and transmission gates for directing a signal along one of two data paths. Each delay cell can receive control signals for selecting the data path.

In order to insert a long delay the signal is sent in a forward direction for a long time and then one of the delay cells along the path is turned on in order to direct the signal along a return path.

The delay chain is typically designed for a particular clock frequency (e.g., 70 MHz). The frequency of the clock signal specifies the period of a cycle of the clock signal. As can be appreciated, for high frequency clock signals, the period is smaller as compared with the period of a lower frequency clock signal. Each delay cell is designed to meet a particular frequency and the smallest delay corresponding to the smallest phase shift required by a particular application.

As can be appreciated, it is desirable for there to be a delay cell design that can accommodate a range of frequencies. Unfortunately, in order to accommodate high frequency clock signals, the delay cells must feature a very small delay. However, when a lower frequency clock signal is encountered, many delay cells must be stacked (e.g., configured in a daisy chain) in order to feature a larger delay required by the slower frequency clock signal.

Another disadvantage of prior approaches is that the design often includes a plurality of parasitic capacitive elements in the signal path. In these schemes, it is difficult to optimize the design of any one element since optimizing one element tends to diminish the performance of other elements in the signal path. Accordingly, it is desirable for there to be a delay cell design that reduces the number of elements in the signal path and simplifies the optimization of components in the delay cell.

In other words, each delay cell is designed for a minimum resolution for the fastest clock. In order to meet the slowest clock and other slower clock frequencies, additional delay cells are stacked. In this manner, each tap (plurality of delay cells) provides a fixed incremental delay.

One difficulty with this approach is that the percentage of the fast clock is smaller than the same percentage of a slower clock (i.e., since the period of the fast clock is less than period of the slower clock, the same percentage of the period of the slower clock is larger than the period of the fast clock). The effect is that more delay elements are needed to handle the slower clock's period. The use of delay elements having a single resolution is inefficient, since a slower clock can have a larger delay. Unfortunately, the additional delay elements occupy more area, thereby increasing the cost of the part incorporating such a design.

Consequently, it is desirable for there to be a delay element that has a variable incremental delay.

It is also desirable for there to be a delay cell that can accommodate clock signals with a range of frequency values.

Another difficulty encountered by the prior art delay cell designs is that any errors in the design of the delay cell is compounded many times since there are typically seven to twenty delay cells per tap and 32 or 64 taps per delay chain. In this regard, it is desirable to reduce the number of delay cells utilized in a delay chain.

Based on the foregoing, there remains a need for a balanced programmable delay element that overcomes the disadvantages set forth previously.

SUMMARY OF THE INVENTION

According to one embodiment of the present invention, a balanced programmable delay element that has a variable incremental delay is provided. The delay element includes a first inverter that has a first electrode for receiving an input signal, a second electrode, a third electrode, and a fourth electrode for providing an output signal. The second electrode and the third electrode form a first current path, and the first inverter has a propagation delay that is dependent on the current through the first current path. The delay element also includes a second inverter that has a first electrode coupled to the fourth electrode of the first inverter for receiving the output signal of the first inverter, a second electrode, a third electrode, and a fourth electrode for providing an output signal. The second electrode and the third electrode form a second current path, and the second inverter has a propagation delay that is dependent on the current through the second current path.

A current switch is coupled to the second electrode of the first inverter, the second electrode of the second inverter, the third electrode of the first inverter, and the third electrode of the second inverter. The current switch receives at least two control signals, and responsive thereto, controls the amount of current through the first current path and the second current path, thereby selectively varying the incremental delay of the delay element.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A balanced programmable delay element is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Delay Cell 300

Figure 3:
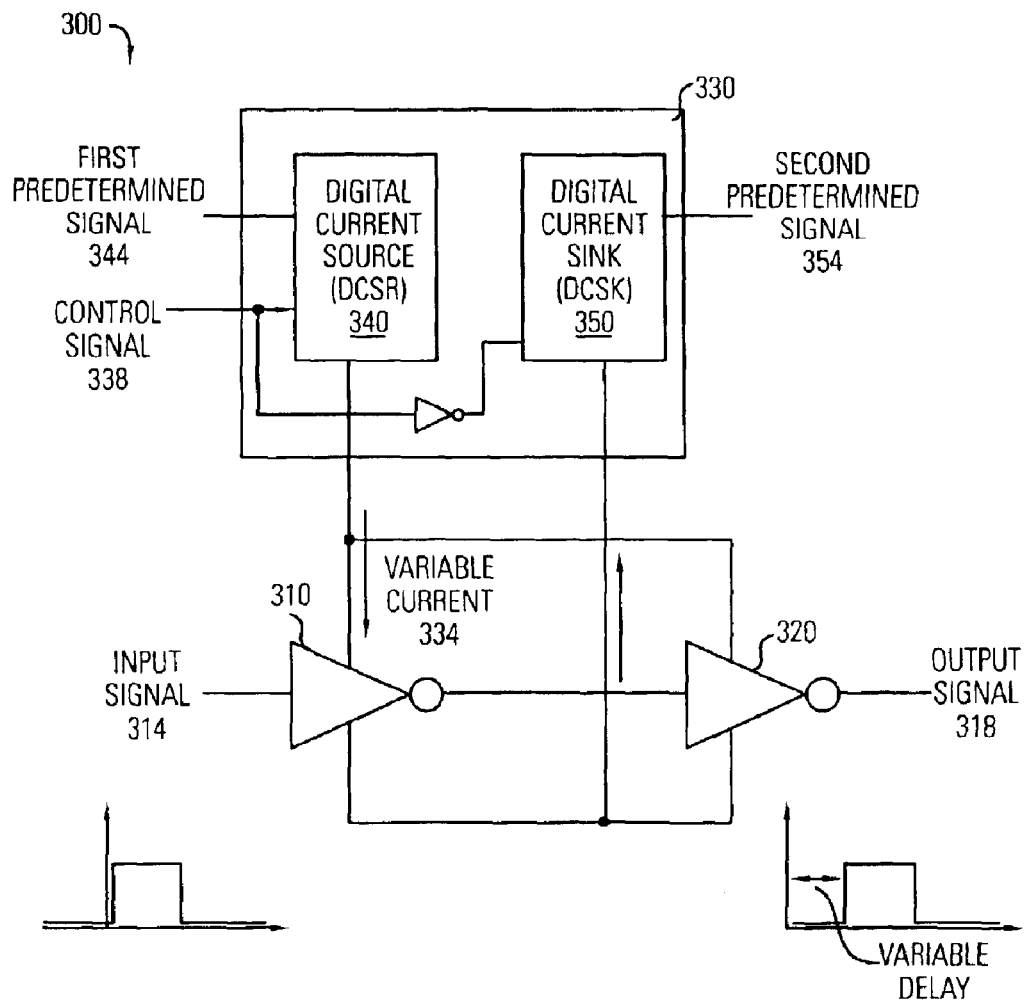
FIG. 3 illustrates a delay cell according to one embodiment of the present invention.

FIG. 3 illustrates a delay cell 300 according to one embodiment of the present invention. The delay cell 300 includes a first inverter 310 for receiving an input signal 314 and a second inverter 320 for generating an output signal 318. The input signal 314 can be, for example, an input clock signal as shown. It is noted that the output signal 318 is the input clock signal delayed by a variable delay 324.

The first inverter 310 and the second inverter 320 receive a variable current 334. One aspect of the present invention is the use of the variable current 334 to control a variable incremental delay of the cell 300 (also referred to herein as a variable propagation delay).

As described in greater detail, the delay 324 is variable in that the delay can be varied by selectively changing the variable current 334. In this manner, the delay cell 300 of the present invention can provide a variable incremental delay 324 that can accommodate a wide dynamic range of frequencies while at the same time conserving space.

The delay cell 300 also includes a digital current switch 330 for providing the variable current 334 to the first inverter 310 and the second inverter 320. Each inverter has a first input and a second input coupled to the digital current switch 330. As described in greater detail hereinafter, the digital current switch 330 selectively varies the variable current 334 in order to change or vary the variable incremental delay 324.

The digital current switch 330 provides a programmable resolution (e.g., a coarse resolution and fine resolution) without unnecessarily wasting area. One manner to achieve the programmable resolution is to apply a weighting scheme (e.g., a binary weighting scheme) to the gate widths of transistors utilized to implement the digital current switch 330. This approach is described in greater detail with reference to FIG. 4.

The digital current switch 330 includes a digital current source (DCSR) 340 and a digital current sink (DCSK) 350. The digital current source (DCSR) 340 includes an input for receiving a first predetermined signal (e.g., a Vdd power signal) and an input for receiving one or more control signals 338 for use in programming the amount of current provided by the digital current source (DCSR) 340. In response to these input signals, digital current source (DCSR) 340 generates the variable current 334.

The digital current sink (DCSK) 350 includes an input for receiving a second predetermined signal (e.g., a ground power signal) and an input for receiving one or more control signals (e.g., an inverted version of the control signals 338) for use in programming the amount of current drawn by the digital current sink (DCSK) 350. In response to these input signals, digital current sink (DCSK) 350 sinks the variable current 334. As can be appreciated, the digital current source (DCSR) 340 and the digital current sink (DCSK) 350 cooperate to manage and selectively vary the variable current 334.

For example, the transistors employed to implement the digital current source (DCSR) 340 and the transistors employed to implement digital current sink (DCSK) 350 are sized in a manner to ensure that the rise and fall times of the inverter are balanced. It is noted that a by-product of balancing the rise and fall times of the inverter is that the amount of current (i.e., the variable current 334) being sourced and sunk is about the same.

Figure 1:
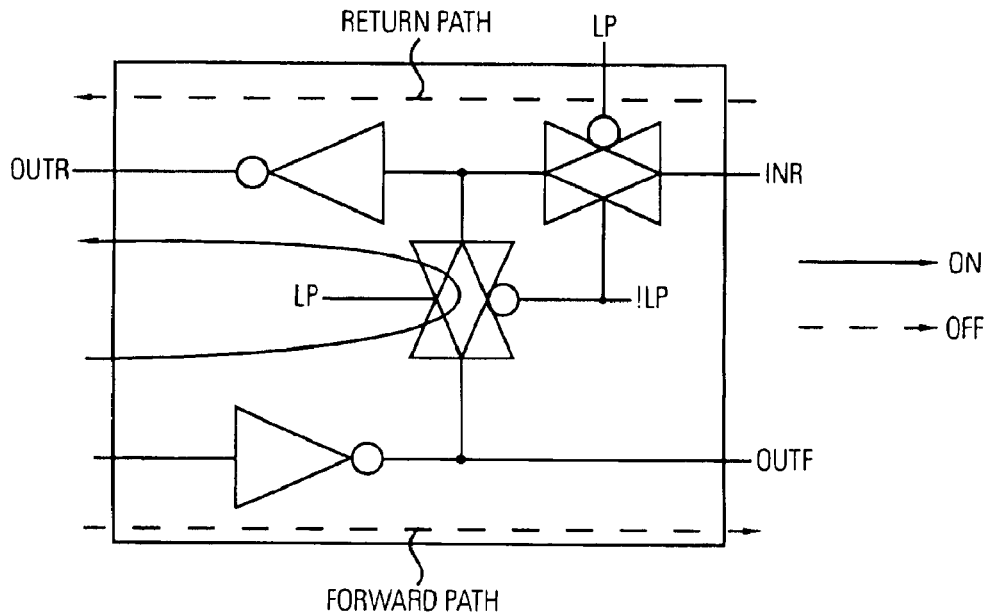
FIG. 1 illustrates a prior art delay cell.
Figure 2:
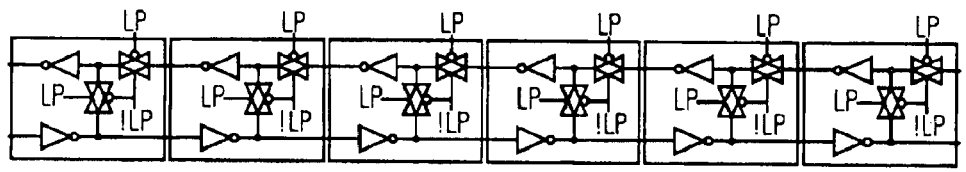
FIG. 2 illustrates how the delay cell of FIG. 1 can be connected with other similar delay cells to form a delay tap.

One advantage of the design of the delay cell 300 of the present invention is that the signal path only includes two inverters. Unlike the design illustrated in FIG. 1, where the delay cell has a forward path, a return path, two transmission gates and two inverter, the design of the delay cell 300 features a single direction signal path that includes only inverters in the signal path.

The two signal paths having different directions and the transmission gate for turning the signal of the prior art tends to complicate the design and optimization of any component in the cell. For example, by improving or optimizing the transmission gate for turning the signal, the performance of the inverters can suffer and deteriorate. Similarly, when the inverters are optimized, the performance of the transmission gate can suffer.

By having a single direction of signal travel and by having only inverters in the signal path, the delay cell of the present invention is easier to optimize that the delay cell of the prior art. Furthermore, since other components of the delay cell 300, such as the digital current switch 330, are de-coupled from the signal path, these components can be optimized independently from the inverters in the signal path. Similarly, the design of the inverters in the signal path can be modified and optimized without affecting the other components in the delay cell, such as the digital current switch 330.

Exemplary Circuit Implementation

Figure 4:
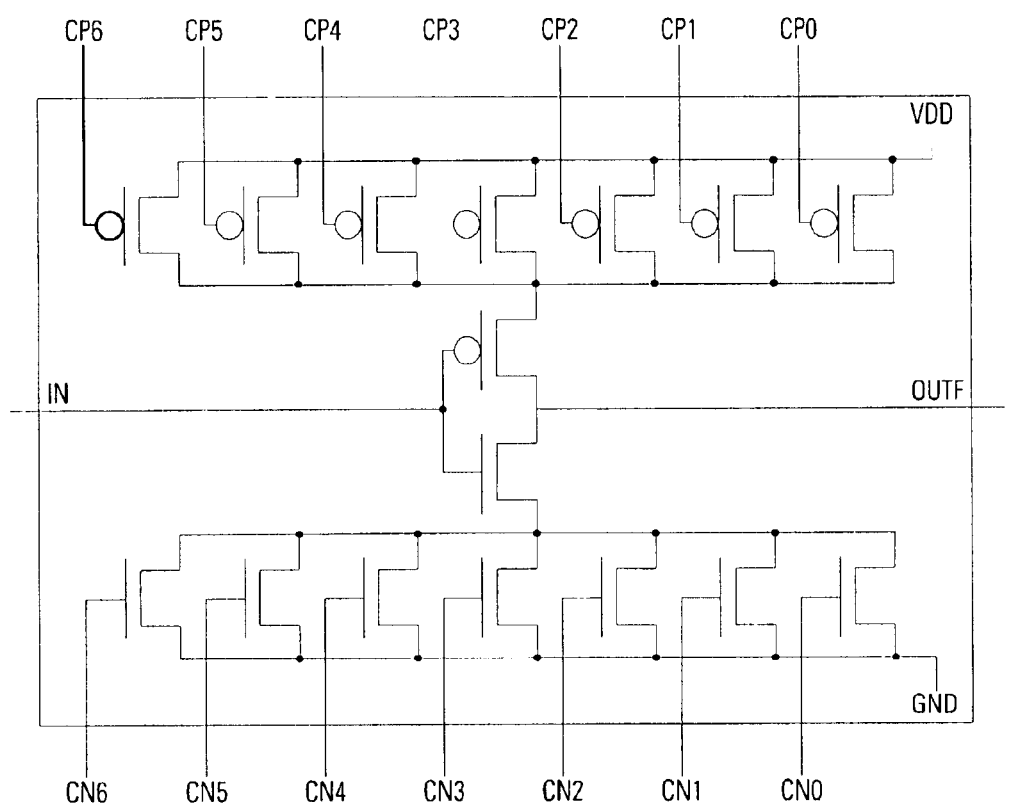
FIG. 4 is a circuit diagram illustrating in greater detail the delay cell of FIG. 3 according to one embodiment of the present invention.

FIG. 4 is a circuit diagram illustrating in greater detail the delay cell of FIG. 3 according to one embodiment of the present invention. In this embodiment, the digital current source (DCSR) 340 is implemented with a plurality of P-type field effect transistors (FETs) that are coupled in parallel with each other. Each of the gates can have differing widths in order to provide increased dynamic range and resolution.

When a binary weighting scheme is employed, the first P-type FET can have a first width (W_0), the second P-type FET can have a second width (W_1=2*W_0), the third P-type FET can have a third width (W_2=2* W_1), the fourth P-type FET can have a fourth width (W_3=2* W_2), etc. In this manner, by selectively asserting one or more of the control signals (e.g., control signals CP0 to CP6), $2^7$ different currents can be provided as the variable current 334 to the first and second inverters 310, 320. It is noted that the delay cell 300 provides the fine granularity required by a fast clock with a fast process, and at the same time provides a coarse granularity of handling longer delays required by a slow clock. Furthermore, the cell 300 of the present invention flexibly provides a range of delays (e.g., a variable incremental delay 324) that can be programmed to suit a particular situation.

Delay Tap

Figure 5:
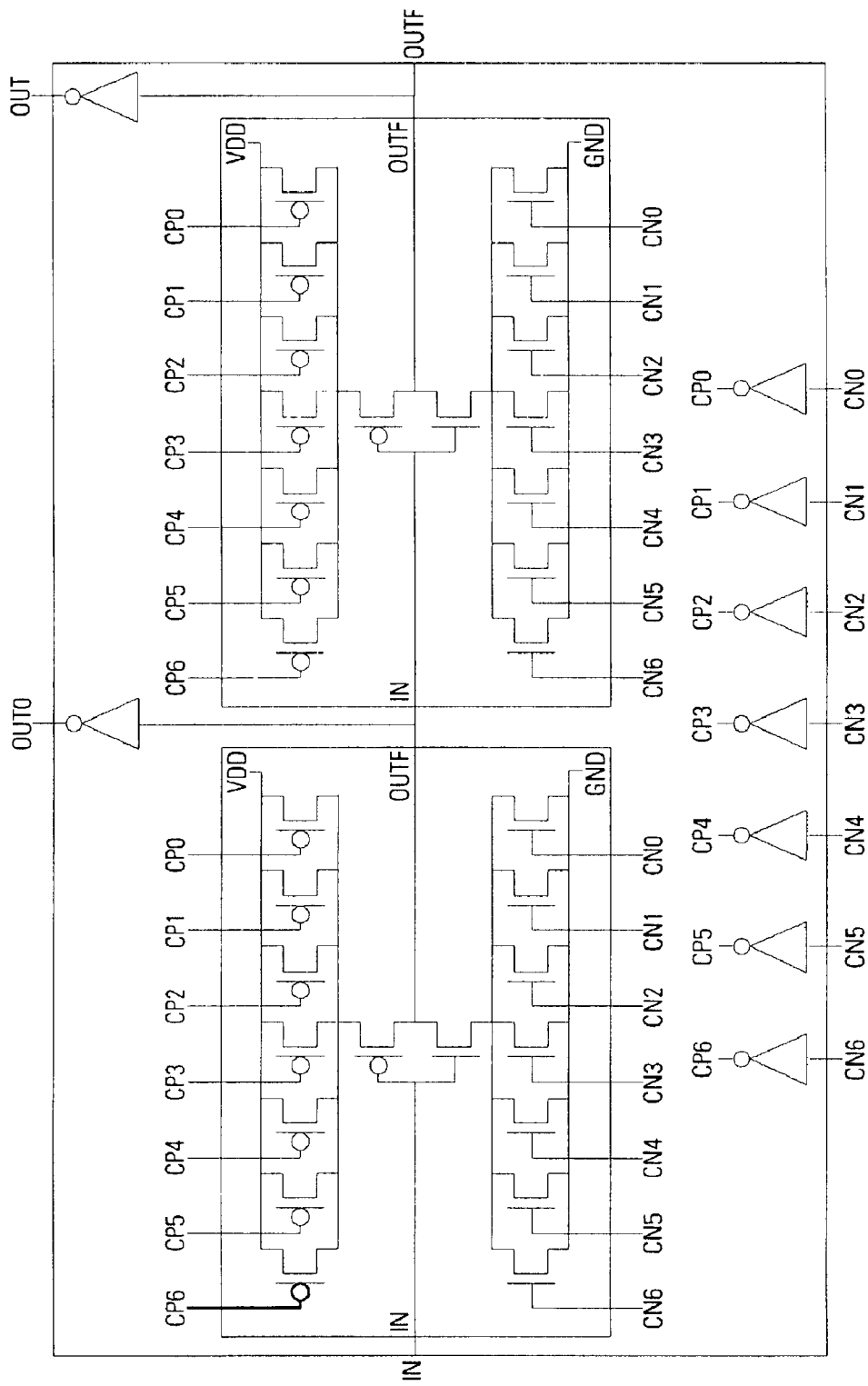
FIG. 5 illustrates how the delay cell of FIG. 4 can be connected with another delay cell to form a delay tap according to one embodiment of the present invention.

FIG. 5 illustrates how the delay cell of FIG. 4 can be connected with another delay cell to form a delay tap according to one embodiment of the present invention. The delay tap employs a separate digital current source (DCSR) 340 and a digital current sink (DCSK) 350 for each inverter. Moreover, the digital current source (DCSR) 340 and a digital current sink (DCSK) 350 pair are arranged in a symmetric fashion in order to provide a balanced duty cycle (e.g., about a 50% duty cycle).

Figure 9:
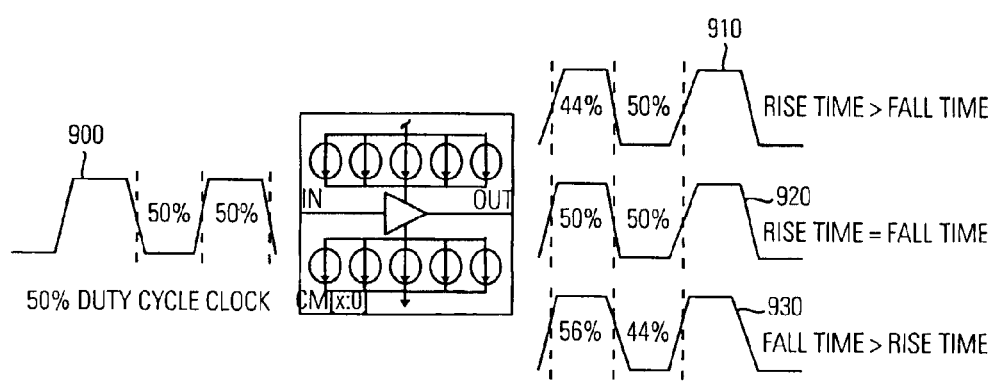
FIG. 9 illustrates output signals that have different duty cycles.

FIG. 9 illustrates exemplary output signals that have different duty cycles. An input signal 900 is provided that has a duty cycle of 50%. Based on this input signal, the delay cell of the present invention can be configured to generate output signals with different duty cycles. Three exemplary output signals are shown. A first output signal 910 has a rise time that is greater than the fall time (44%, 56% duty cycle). A second output signal 920 has a rise time that is equal to the fall time (50% duty cycle). A third output signal 930 has a fall time that is greater than the rise time (56%, 44% duty cycle). Preferably, the delay cell of the present invention is configured to be a balanced cell that generates output signals that are similar to the second output signal 920.

It is also noted as the dynamic range of the input frequencies increases, the delay tap 400 of the present invention provides increased area savings as compared to prior art approaches. In other words, when the dynamic range reaches a predetermined range, the cumulative area of the delay tap that is made up of prior art delay cells is greater than the area of the new delay tap that has two new delay cells.

Furthermore, the prior art delay tap requires more delay cells as the dynamic range of the input frequencies increase (i.e., there is a strong dependence between the number of delay cells required and the dynamic range of the circuit). For example, each prior art delay tap typically includes multiple delay cells (e.g., 12 delay cells). In contrast, since only two delay cells are needed to implement each delay tap of the present invention, the number of delay cells needed is not dependent on the dynamic range.

It is noted that the number of delay cells depends on the frequency range of the input clock signal, the PVT variation, and other factors. The number of taps depends on the particular application.

Exemplary Delay Lock Loop

Figure 6:
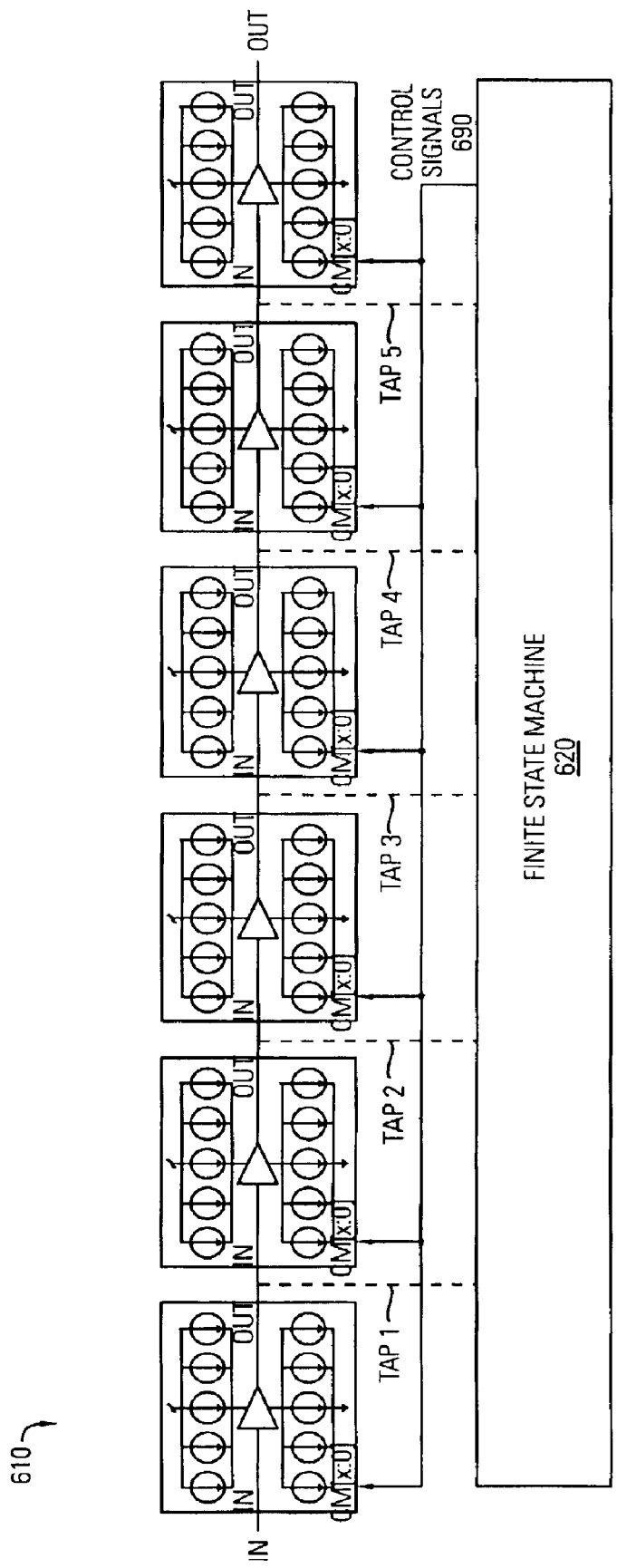
FIG. 6 illustrates how a plurality of delay taps of FIG. 5 can be connected to form a delay lock loop (DLL) that is controlled by a digital controller.

FIG. 6 illustrates how a plurality of delay taps of FIG. 5 can be connected to form a delay lock loop (DLL) 610. The DLL 610 includes a finite state machine 620 and a plurality of delay taps 630–680. Each of the delay taps 630–680 generates a respective tap (e.g., tap1, tap2, . . . tap 5). The FSM 620 utilizes the taps (e.g., tap1, tap2, . . . , tap 5) for performing delay lock loop functions. The FSM 620 also selectively controls each of the delay taps 630–680 by utilizing control signals 690 that are provided to the CN[x:0] inputs of each delay tap.

Exemplary Clock Signals

Figure 7:
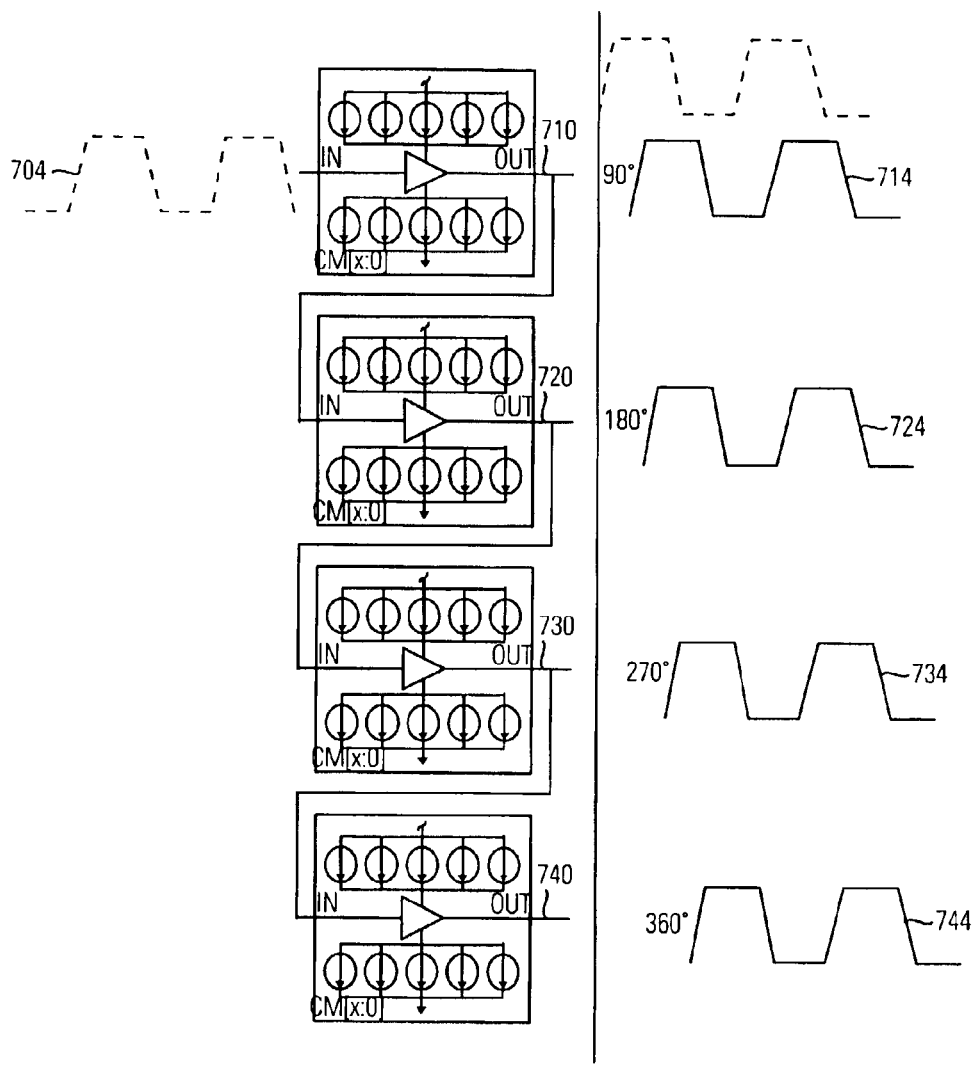
FIG. 7 illustrates exemplary clock signals that may be generated by the delay tap in a clock generation application according to one embodiment of the present invention.

FIG. 7 illustrates exemplary clock signals that may be generated by the delay tap in a clock generation application according to one embodiment of the present invention. The first tap 710 provides a clock signal 714 that has a ninety-degree phase or delay with respect to the input signal 704. The second tap 720 provides a clock signal 724 that has a one hundred eighty degree phase or delay with respect to the input signal. The third tap 730 provides a clock signal 734 that has a two hundred and seventy degree phase or delay with respect to the input signal. The fourth tap 740 provides a clock signal 744 that has a three hundred sixty degree phase or delay with respect to the input signal.

Figure 8:
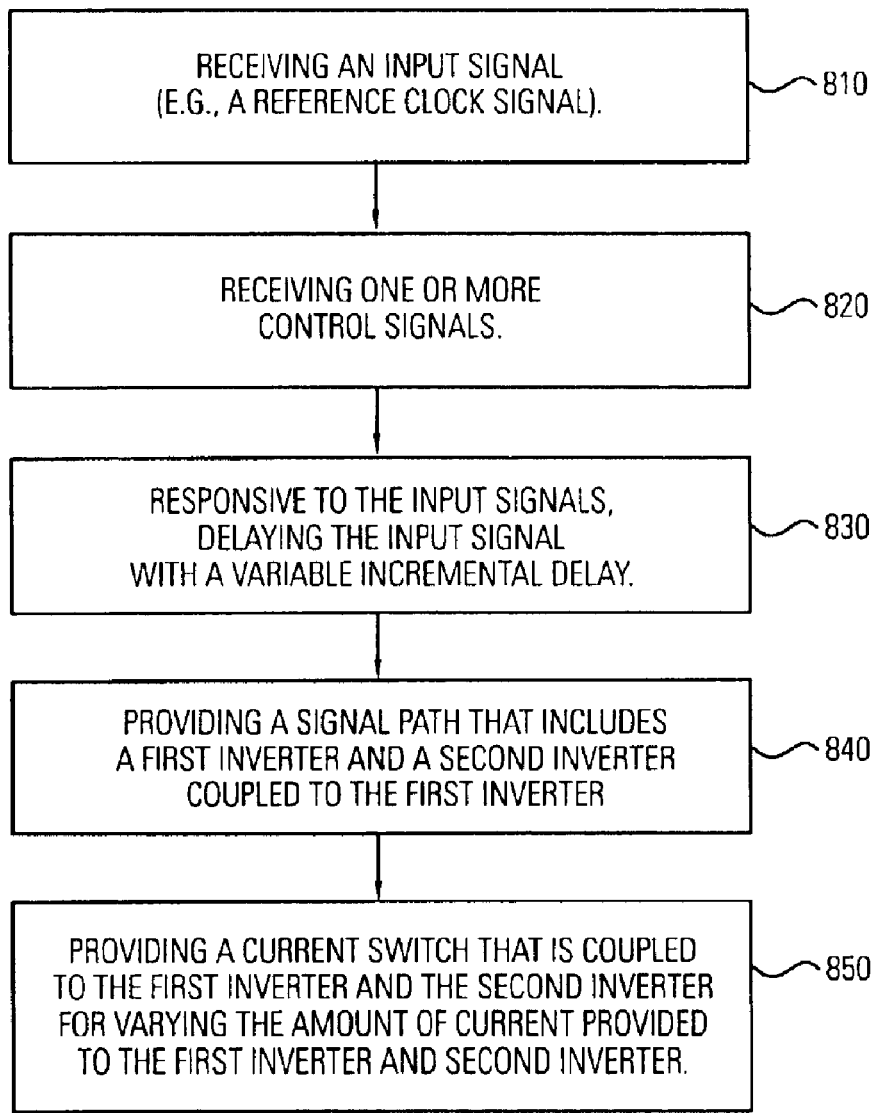
FIG. 8 is a flowchart illustrating the processing steps for providing a delay cell with a variable incremental delay.

FIG. 8 is a flowchart illustrating the processing steps for providing a delay cell with a variable incremental delay. In step 810, an input signal (e.g., a reference clock signal) is received. In step 820, one or more control signals are received. These control signals can be utilized to program the variable incremental delay. In step 830, responsive to the input signals, the input signal is delayed with a variable incremental delay. The variable incremental delay can depend, for example, on the variable current provided by the digital current switch 330 and programmed by the control signals.

In step 840, a signal path that includes a first inverter and a second inverter coupled to the first inverter is provided. In step 850, a current switch that coupled to the first inverter and the second inverter for varying the amount of current provided to the first inverter and the second inverter is provided. The delay element generates an output signal that is the input signal with a time delay, wherein the time delay is based on the varying current (variable current 334) provided by the current switch.

The balanced programmable delay element of the present invention has a variable incremental delay for selectively providing a coarse resolution or a fine resolution depending on the frequency of the input clock signal. The variable incremental delay of the balanced programmable delay element of the present invention also allows the delay chain to have a wide dynamic range.

For example, the balanced programmable delay element of the present invention can be utilized to generate a plurality (e.g., 32 or 64 taps depending on the requirements of a particular application) of equally spaced phases of an input clock signal. Although the balanced programmable delay element of the present invention has been described in connection with a clock generation application for use in a pulse width modulation (PWM) functional block, it is to be appreciated that the balanced programmable delay element can benefit other delay lock loop (DLL) applications. For example, a DLL having the balanced programmable delay element of the present invention can be utilized to zero out an insertion delay in a clock signal. The DLL having the balanced programmable delay element of the present invention can also be utilized in data recovery applications (e.g., high-speed serial link having an asynchronous input).

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A delay element: comprising:
   a) a first inverter having a first electrode for receiving an input signal, a second electrode, a third electrode, and a fourth electrode for providing an output signal, the second electrode and the third electrode forming a first current path, the first inverter having a propagation delay; wherein the propagation delay is dependent on the current through the first current path;
   b) a second inverter having a first electrode coupled to the fourth electrode of the first inverter for receiving the output signal of the first inverter, a second electrode, a third electrode, and a fourth electrode for providing an output signal, the second electrode and the third electrode forming a second current path, the second inverter having a propagation delay; wherein the propagation delay is dependent on the current through the second current path; and
   c) a current switch coupled to the second electrode of the first inverter, the second electrode of the second inverter, the third electrode of the first inverter, and the third electrode of the second inverter, the current switch for receiving at least two control signals, and responsive thereto for controlling the amount of current through the first current path and the second current path; wherein the delay element provides a variable incremental delay that is programmed by the control signals; wherein the current switch includes a plurality of transistors; wherein each transistor has a gate with a width; wherein a binary weighting scheme is applied to the gate widths of the plurality of transistors to provide a delay with a programmable resolution.

2. The delay element of claim 1 wherein the current switch includes
   a digital current source having a first transistor that has a gate for receiving a first control signal of the at least two control signals, the gate having a first width; and second transistor having a gate for receiving a second control signal of the at least two control signals, the gate having a second width; and
   a digital current sink having a first transistor that has a gate for receiving the first control signal, the gate having a first width; and second transistor having a gate for receiving the second control signal, the gate having a second width.

3. The delay element of claim 1
   wherein the current switch includes a plurality of transistors, each transistor having a gate with a width; and
   wherein the widths of the gates of the transistors are weighted in a predetermined fashion.

4. The delay element of claim 1 wherein the current switch includes a digital current sink that includes a plurality of transistors coupled in parallel, wherein each transistor includes a first electrode for receiving a first predetermined power signal, a second electrode for receiving a control signal of the at least two control signals, and a third electrode coupled to the second electrode of the first inverter and the second electrode of the second inverter.

5. The delay element of claim 2 wherein the digital current sink includes a plurality of field effect transistors (FETs).

6. The delay element of claim 5 wherein the plurality of field effect transistors in the digital current sink includes a plurality of N-type field effect transistors.

7. The delay element of claim 1 wherein the current switch includes a digital current source that includes a plurality of transistors coupled in parallel, wherein each transistor includes a first electrode coupled to the third electrode of the first inverter and the third electrode of the second inverter, a second electrode for receiving a control signal of the at least two control signals, and a third electrode for receiving a second predetermined power signal.

8. The delay element of claim 7 wherein the plurality of transistors in the digital current source includes a plurality of field effect transistors (FETs).

9. The delay element of claim 8 wherein the plurality of field effect transistors in the digital current source includes a plurality of P-type field effect transistors.

10. The delay element of claim 1 wherein the current switch includes
    a plurality of transistors, each transistor having a gate with a width; and wherein the widths of the gates of the transistors are weighted in a predetermined fashion.

11. The delay element of claim 1 wherein the variable incremental delay varies with respect to the amount of current provided through the first current path and the second current path.

12. The delay element of claim 1 wherein the delay element has a large dynamic range.

13. The delay element of claim 1 wherein the delay element provides a delay with a coarse resolution for slow frequency signals and a delay with a fine resolution for high frequency signals.

14. A method for providing a variable incremental delay through a delay element, the method comprising:
   a) receiving an input signal;
   b) receiving at least one control signal;
   c) providing a signal path for the input signal that includes a first inverter and a second inverter coupled to the first inverter;
   d) providing a current switch coupled to the first inverter and the second inverter for providing a variable current to the first inverter and the second inverter based on the received control signal; wherein the current switch includes a plurality of transistors; wherein each transistor has a gate with a width; wherein a binary weighting scheme is applied to the gate widths of the plurality of transistors to provide a delay with a programmable resolution;
   wherein the delay element generates an output signal that is the input signal with a time delay, wherein the delay element provides a variable incremental time delay that is based on the variable current provided by the current switch.

15. The method of claim 14 further comprising the steps of:
   e) providing a first transistor having a current path for selectively providing a first portion of the variable current to the first inverter and the second inverter;
   f) providing a second transistor having a current path for selectively providing a second portion of the variable current to the first inverter and the second inverter;
   wherein the first transistor and the second transistor are each controlled by the control signal.

16. The delay element of claim 1 wherein the current switch is a digital current switch that provides a delay with a programmable resolution.

17. The delay element of claim 1 wherein the delay element selectively provides one of a delay with a coarse resolution and a delay with a fine resolution depending on the frequency of the input signal.

18. The delay element of claim 1 wherein the current switch includes a first plurality of transistors that are coupled in parallel for providing a first variable current to the first inverter and the second inverter; wherein each transistor in the first plurality of transistor includes a first electrode coupled to a first predetermined voltage and a second electrode coupled to the second electrode of the first inverter and the second electrode of the second inverter; wherein the propagation delay through the first inverter and the propagation delay through second inverter is dependent on the first variable current;
   a second plurality of transistors that are coupled in parallel for providing a second variable current to the first inverter and the second inverter; wherein each transistor in the second plurality of transistor includes a first electrode coupled to the third electrode of the first inverter and the third electrode of the second inverter and a second electrode coupled to a second predetermined voltage; wherein the propagation delay through the first inverter and the propagation delay through second inverter is dependent on the second variable current.

19. The delay element of claim 18 wherein the first plurality of transistors includes a first current capacity and the second plurality of transistors includes a second current capacity; wherein the first current capacity is proportional to the second current capacity.

* * * * *